(12) United States Patent
Kondou et al.

(10) Patent No.: US 8,420,860 B2
(45) Date of Patent: Apr. 16, 2013

(54) COMPOUND AND COLOR FILTER (75) Inventors: Hitoshi Kondou, Chiba (JP); Shougo Yamada, Chiba (JP); Ryousuke Asami, Chiba (JP); Katsunori Shimada, Chiba (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/637,290

(22) PCT Filed: Sep. 21, 2011

(86) PCT No.: PCT/JP2011/071458
§ 371 (c)(1),
(2), (4) Date: Sep. 25, 2012

(87) PCT Pub. No.: WO2012/039416
PCT Pub. Date: Mar. 29, 2012

(65) Prior Publication Data
US 2013/0018198 A1 Jan. 17, 2013

(30) Foreign Application Priority Data
Sep. 24, 2010 (JP) .................................. 2010-213611

(51) Int. Cl.
| C07C 213/00 | (2006.01) |
| C07C 215/00 | (2006.01) |
| C07C 217/00 | (2006.01) |
| C07C 221/00 | (2006.01) |
| C07C 223/00 | (2006.01) |
| C07C 225/00 | (2006.01) |
| C08J 5/12 | (2006.01) |

(52) U.S. Cl.
USPC ....................................... 564/283; 106/287.3

(58) Field of Classification Search .................... None
See application file for complete search history.

(56) References Cited

U.S. PATENT DOCUMENTS
4,142,914 A 3/1979 Bast et al.

FOREIGN PATENT DOCUMENTS
| JP | 53-105531 A | 9/1978 |
| JP | 2001-081348 A | 3/2001 |
| JP | 2010-083912 A | 4/2010 |
| JP | 2010-085444 A | 4/2010 |
| JP | 2010-249869 A | 11/2010 |
| JP | 2011-006602 A | 1/2011 |
| JP | 2011-150195 A | 8/2011 |
| JP | 2011-186043 A | 9/2011 |

Primary Examiner — Johann Richter
Assistant Examiner — Jennifer C Sawyer
(74) Attorney, Agent, or Firm — McDermott Will & Emery LLP (57) ABSTRACT

The present invention provides a triarylmethane compound and a color filter containing the compound in a blue pixel portion, the triarylmethane compound being capable of providing a colored material which causes little change in hue over a long period of time even under high temperature or light irradiation. For example, when used for preparing a blue pixel portion of a color filter, the triarylmethane compound is capable of providing a liquid crystal display device or the like which can provide a high-brightness liquid crystal display having excellent brightness over a long period of time even under high temperature or light irradiation. The triarylmethane compound contains, as a counter anion for a basic triarylmethane dye cation, a heteropolyoxometalate anion represented by $(P_2Mo_yW_{18-y}O_{62})^{6-}/6$ wherein y=an integer of 1, 2, or 3, and the color filter contains the triarylmethane compound in a blue pixel portion.

4 Claims, 1 Drawing Sheet

COMPOUND AND COLOR FILTER

CROSS REFERENCE TO PRIOR APPLICATIONS

This application is a U.S. National Phase application under 35 U.S.C. §371 of International Application No. PCT/JP2011/071458, filed on Sep. 21, 2011 and claims benefit of priority to Japanese Patent Application No. 2010-213611, filed on Sep. 24, 2010. The International Application was published in Japanese on Mar. 29, 2012 as WO 2012/039416 A1 under PCT Article 21(2). The contents of the above applications are hereby incorporated by reference.

TECHNICAL FIELD

The present invention relates to a triarylmethane compound which, for example, when used as a colorant, can provide colored materials with small changes in hue over a long period of time even under heat history at a high temperature or under light irradiation, and also relates to a color filter containing the compound in a blue pixel portion.

BACKGROUND ART

Color filters of a liquid crystal display device and the like each have a red pixel portion (R), a green pixel portion (G), and a blue pixel portion (B). Any one of these pixel portions has a structure in which a synthetic resin thin film containing an organic pigment dispersed therein is provided on a substrate, and an organic pigment of each of the red, green, and blue colors is used as the organic pigment.

As a blue organic pigment used for forming the blue pixel portion among these pixel portions, an ε-type copper phthalocyanine pigment (C. I. Pigment Blue 15:6) is generally used, and if required, it is combined with a small amount of a dioxazine violet pigment (C. I. Pigment Violet 23) as a violet organic pigment for toning.

The organic pigments used for forming a color filter are required to have characteristics completely different from those for conventional general applications, specifically, the characteristic of more brightening (increasing brightness) a display screen of a liquid crystal display device or the like. However, high brightness cannot be achieved by combination of the ε-type copper phthalocyanine pigment and the dioxazine violet pigment, and thus particularly, the organic pigment used in the blue pixel portion (B) is required to increase brightness.

In order to comply with such higher brightness, using a triarylmethane pigment, such as C. I. Pigment Blue 1, which is superior in brightness to the ε-type copper phthalocyanine pigment, in a blue pixel portion of a color filter has been recently being investigated (Patent Literatures 1 to 3).

Fanal Color (Fanal Blue D6340 and 6390) of BASF Corporation having a chemical structure below is notable as the C. I. Pigment Blue 1, and the C. I. Pigment Blue 1 is produced by laking Victoria Pure Blue BO, which is a basic triarylmethane dye, with a heteropoly acid such as phosphomolybdic acid, phosphotungstomolybdic acid, or the like. The resultant C. I. Pigment Blue 1 includes counter ion $X^-$ represented by Keggin-type $PMo_xW_{12-x}O_{40}$ for a cation.

[Chem. 1]

[In general formula (II), $R^1$, $R^2$, and $R^3$ are each an ethyl group, $R^4$ is a hydrogen atom, and $X^-$ is a Keggin-type phosphotungstomolybdic acid anion or phosphomolybdic acid anion.]

However, even by using the triarylmethane pigment for preparing the blue pixel portion of a color filter, satisfactory brightness cannot yet be maintained over a long period of time under a high temperature of 200° C. or more or under light irradiation, and the actual condition is that heat resistance and light resistance are unsatisfactory.

CITATION LIST

Patent Literature
PTL 1: Japanese Unexamined Patent Application Publication No. 2001-81348
PTL 2: Japanese Unexamined Patent Application Publication No. 2010-83912
PTL 3: Japanese Unexamined Patent Application Publication No. 2010-85444

SUMMARY OF INVENTION

Technical Problem

A problem to be solved by the present invention is to provide a triarylmethane compound and a color filter in which a blue pixel portion contains the triarylmethane compound, the triarylmethane compound being capable of providing colored materials which cause small changes in hue over a long period of time even under heat history at a high temperature or under light irradiation. For example, when used for preparing a blue pixel portion of a color filter, the triarylmethane compound is capable of providing a liquid crystal display device or the like which can provide a high-brightness liquid crystal display with excellent brightness over a long period of time even under a high temperature or light irradiation.

Solution to Problem

As a result of keen research in consideration of the above-described situation, the inventors of the present invention have found that when a triarylmethane compound is a compound in which a counter anion for a basic triarylmethane dye cation is a specified anion, a change in hue of a colored material can be selectively decreased, and heat resistance and light resistance can be significantly improved, leading to the achievement of the present invention.

The present invention provides a compound represented by general formula (I) below.

[Chem. 2]

(I)

[In the general formula (I), $R^1$, $R^2$, $R^3$, and $R^4$ may be the same or different and are each a hydrogen atom, an alkyl group having 1 to 3 carbon atoms, or a phenyl group, and $X^-$ is a heteropolyoxometalate anion represented by $(P_2Mo_yW_{18-y}O_{62})^{6-}/6$ wherein y=an integer of 1, 2, or 3.]

Also, the present invention provides a color filter including a blue pixel portion which contains the compound represented by the general formula (I).

Advantageous Effects of Invention

A triarylmethane compound of the present invention is a triarylmethane compound represented by specified general formula (I), and can thus selectively decrease a change in hue of a colored material and significantly improve heat resistance and light resistance. In particular, the compound exhibits the highly remarkable technical effect that the brightness of a color filter of a liquid crystal display device or the like can be significantly improved in heat resistance and light resistance.

A color filter of the present invention includes a blue pixel portion which contains a triarylmethane compound represented by specified general formula (I). Therefore, the color filter exhibits the highly remarkable technical effect of providing a liquid crystal display device or the like which can provide an image display with higher brightness over a long period of time even under a high temperature or light irradiation.

DESCRIPTION OF EMBODIMENTS

Figure 1:
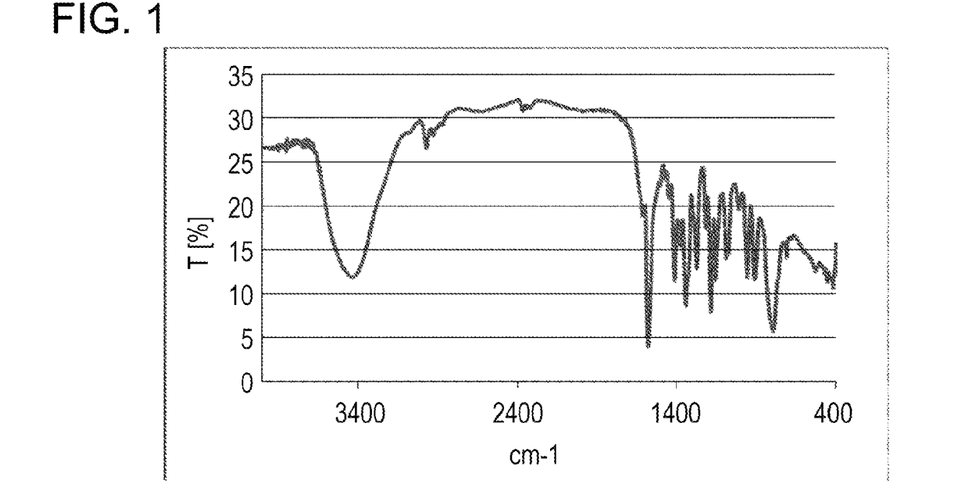
FIG. 1 is a diagram showing a Fourier transform infrared absorption spectrum of a triarylmethane compound produced in Example 1.
Figure 2:
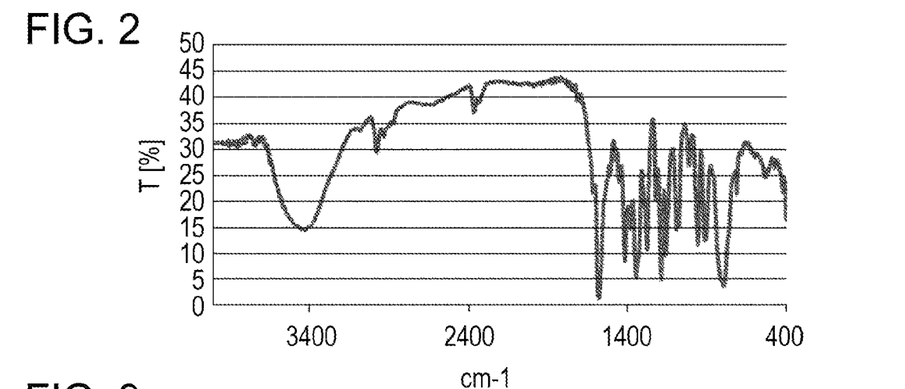
FIG. 2 is a diagram showing a Fourier transform infrared absorption spectrum of a triarylmethane compound produced in Example 3.
Figure 3:
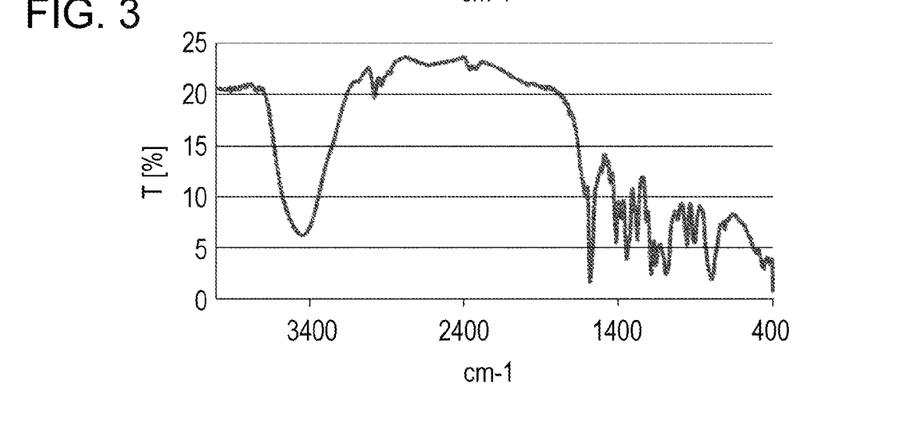
FIG. 3 is a diagram showing a Fourier transform infrared absorption spectrum of a triarylmethane compound produced in Example 4.

A triarylmethane compound of the present invention is a compound represented by general formula (I) below.

[Chem. 3]

(I)

[In the general formula (I), $R^1$, $R^2$, $R^3$, and $R^4$ may be the same or different and are each a hydrogen atom, an alkyl group having 1 to 3 carbon atoms, or a phenyl group, and $X^-$ is a heteropolyoxometalate anion represented by $(P_2Mo_yW_{18-y}O_{62})^{6-}/6$ wherein y=an integer of 1, 2, or 3.]

The compound of the general formula (I) of the present invention contains an anion moiety composed of $X^-$ and a basic triarylmethane dye cation which is a moiety excluding $X^-$. A publicly known triarylmethane compound contains a phosphotungstomolybdic acid anion or phosphomolybdic acid anion as $X^-$, while $X^-$ of the present invention is a heteropolyoxometalate anion represented by $(P_2Mo_yW_{18-y}O_{62})^{6-}/6$ wherein y=an integer of 1, 2, or 3.

In the compound of the general formula (I) of the present invention, $R^1$, $R^2$, $R^3$, and $R^4$ may be the same or different and are each a hydrogen atom, a methyl group, an ethyl group, a n-propyl group, an iso-propyl group, or a phenyl group.

Examples of a preferred structure of the cation moiety include a structure [corresponding to Victoria Blue BO (Basic Blue 7)] where on nitrogen atoms, $R^1$, $R^2$, and $R^3$ are ethyl groups, and $R^4$ is a hydrogen atom; a structure [corresponding to Victoria Blue B (Basic Blue 26)] where on nitrogen atoms, both $R^1$ and $R^2$ are methyl groups, $R^3$ is a phenyl group, and $R^4$ is a hydrogen atom; a structure [corresponding to Victoria Blue R (Basic Blue 11)] where on nitrogen atoms, both $R^1$ and $R^2$ are methyl groups, $R^3$ is an ethyl group, and $R^4$ is a hydrogen atom; and a structure [corresponding to Victoria Blue 4R (Basic Blue 8)] where on nitrogen atoms, all $R^1$, $R^2$, and $R^3$ are methyl groups, and $R^4$ is a phenyl group. The parenthetical expression indicates a corresponding dye having the same structure in a cation moiety. That is, as described below, these structures are publicly known in view of only the cation structure.

The compound of the present invention is characterized in that the counter anion $X^-$ is a specified anion. The anion of the compound of the present invention is a heteropolyoxometalate anion represented by $(P_2Mo_yW_{18-y}O_{62})^{6-}/6$ wherein y=an integer of 1, 2, or 3.

Such a heteropoly acid can be easily produced according to a method described in, for example, Inorganic Chemistry, vol. 47, p. 3679. Specifically, the heteropoly acid can be produced by dissolving a tungstic acid alkali metal salt and a molybdic acid alkali metal salt in water, adding phosphoric acid to the resultant solution, and then heat-stirring the mixture under heating reflux for 5 to 10 hours. The resulting heteropoly acid is reacted with an alkali metal chloride to produce a Dawson-type heteropolyoxometalate alkali metal salt in the same manner as described above.

The number y of molybdenum atoms in the heteropolyoxometalate anion can be adjusted in the range of 1 to 3 by adjusting the molar ratio between molybdenum (Mo) and tungsten (W) charged, i.e., the molar ratio between the tungstic acid alkali metal salt and the molybdic acid alkali metal salt.

Another method for producing the heteropoly acid includes dissolving a molybdic acid alkali metal salt in water, adding hydrochloric acid to the resultant solution, adding an α2 defective Dawson-type phosphotungstic acid alkali metal salt to the resulting mixture, and then stirring the mixture at 10 to 30° C. for 30 minutes to 2 hours. The resulting heteropoly acid is reacted with an alkali metal chloride to produce a Dawson-type heteropolyoxometalate alkali metal salt in the same manner as described above.

For example, only $P_2Mo_1W_{17}O_{62}$ can be produced by reacting Mo with α2-type $P_2W_{17}O_{61}$ prepared by hydrolysis reaction of $P_2W_{18}O_{62}$. In this case, the heteropoly acid with no distribution of y values or an alkali metal salt thereof can be produced.

When the above-described method for producing the Dawson-type heteropolyoxometalate alkali metal salt has difficulty in recovering precipitates from a reaction solution, solubility is decreased by cooling the reaction solution so that the Dawson-type heteropolyoxometalate alkali metal salt can be produced in high yield.

The compound of the present invention can be easily produced by, for example, reacting the corresponding dye with the corresponding heteropoly acid or heteropolyoxometalate alkali metal salt. When the above-described dye including a chloride ion as an anion and the heteropoly acid are used, the compound can be produced by salt substitution through dehydrochlorination reaction, while when the above-described dye including a chloride ion as an anion and the heteropolyoxometalate metal salt are used, the compound can be produced by salt substitution through alkali metal chloride elimination reaction.

In comparison to the dehydrochlorination reaction using the heteropoly acid, the alkali metal chloride elimination reaction of the heteropolyoxometalate alkali metal salt resulting from the heteropoly acid is preferred because it is possible to more securely perform salt substitution, produce the triarylmethane compound of the present invention in higher yield, and produce the triarylmethane compound of the present invention with higher purity and less by-products. Of course, the heteropolyoxometalate alkali metal salt can also be used after being purified by recrystallization or the like. The defective Dawson-type phosphotungstic acid alkali metal salt can be easily produced using a Dawson-type phosphotungstic acid heteropolyoxometalate alkali metal salt as a raw material according to the method described in, for example, Inorganic Synthesis, vol. 27, p. 104. Specifically, the defective Dawson-type phosphotungstic acid alkali metal salt can be produced by dissolving the Dawson-type phosphotungstic acid heteropolyoxometalate alkali metal salt in water, adding an alkali metal hydrogencarbonate to the resultant solution, and stirring the mixture, if required, under heating.

Examples of the heteropolyoxometalate alkali metal salt include $K_6(P_2MoW_{17}O_{62})$, $K_6(P_2Mo_2W_{16}O_{62})$ and $K_6(P_2Mo_3W_{15}O_{62})$, and these may be used alone or in combination of two or more.

Since a dye-derived cation is monovalent, the above-described reaction is preferably effected by charging as an anion source the heteropoly acid or heteropolyoxometalate alkali metal salt so that the amount of use is an equal number of moles according to the ionic valency thereof.

The triarylmethane compound of the present invention is subjected to a step of laking with a heteropoly acid (water-insolubilizing) (or has been laked with a heteropoly acid (water-insolubilized). Therefore, when water is used during the production process or in a step after production, water containing metal ions and halogen ions at as low contents as possible, for example, purified water, ion exchange water, pure water, or the like, is preferably used for securely performing reaction and preventing breakage of the lake structure of the resultant compound.

The triarylmethane compound of the present invention has a structure in which a publicly known cation structure and a publicly known anion structure are combined, and thus can be easily identified by confirming that a product produced according to the above-described production method contains both the cation structure and the anion structure. Measurement of an infrared absorption spectrum of the product can confirm that the structures of the raw materials used for the reaction remain. In addition, since the product does not contain the anion of the dye and the cation of heteropolyoxometalate used as the raw materials for the reaction, the laking reaction can be confirmed by decrease in intensity or disappearance of the peaks characteristic of the raw materials in fluorescent X-ray analysis. (If required, more secured identification can be made by elemental analysis of the product.)

When the triarylmethane compound of the present invention is a pigment, the compound greatly contributes to fastness, but when the compound is a dye, the compound cannot exhibit the excellent technical effect of the present invention in spite of being composed of cation and anion. In addition, the triarylmethane compound of the present invention is a pigment which may be a hydrate containing 4 to 7 molecules of crystal water or an anhydride without crystal water.

The triarylmethane compound of the present invention is a pigment because it has a lake structure and is water-insoluble. The thus-produced triarylmethane compound of the present invention can be directly used as a colorant for synthetic resins and the like, but if required, the compound can be used as a colorant optimum for various applications by adjusting the particle diameter through publicly known common grinding or agglomeration. A dry powder of the colorant preferably has an average primary particle diameter of 100 nm or less because a more vivid blue colored material can be easily obtained.

In the present invention, the average primary-particle diameter is measured as follows. First, particles are photographed within a field of view with a transmission electron microscope or scanning electron microscope. Then, on a two-dimensional image, the maximum length of the inner diameter of each of 50 primary particles constituting aggregates is determined, and an average of the maximum lengths of the particles is regarded as the average primary-particle diameter.

The triarylmethane compound of the present invention causes a small change in hue through heat history at a high temperature and has excellent heat resistance in various publicly known common applications. Therefore, use of the compound for producing a color filter pixel portion can produce a color filter of a liquid crystal display device having high brightness and excellent heat resistance of brightness and being capable of a bright image display over a long period of time.

The color filter of the present invention can use, as a back light source, any one of a conventional cold-cathode tube (CCFL light source), a white LED (LED: Light Emitting Diode) light source, an independent 3-color LED light source, a white organic EL (EL: Electro Luminescence) light source, and the like.

If required, the triarylmethane compound of the present invention can contain a ε-type copper phthalocyanine pigment, a dioxazine pigment (C. I. Pigment Violet 23, C. I. Pigment Violet 37, C. I. Pigment Blue 80, or the like), or the like; an organic pigment derivative such as a sulfonic acid derivative of metal-free or metal phthalocyanine, an N-(dialkylamine)methyl derivative of metal-free or metal phthalocyanine, an N-(dialkylaminoalkyl)sulfonic acid amide derivative of metal-free or metal phthalocyanine, a sulfonic acid derivative of dioxazine violet, a sulfonic acid derivative of indanthrene blue, phthalocyanine sulfonic acid, or the like; a dispersant such as BYK Chemie Disperbyk 130, Disperbyk 161, Disperbyk 162, Disperbyk 163, Disperbyk 170, Disperbyk 171, Disperbyk 174, Disperbyk 180, Disperbyk 182, Disperbyk 183, Disperbyk 184, Disperbyk 185, Disperbyk 2000, Disperbyk 2001, Disperbyk 2020, Disperbyk 2050, Disperbyk 2070, Disperbyk 2096, Disperbyk 2150, Disperbyk LPN21116, or Disperbyk LPN6919, Efka Chemicals Company Efka 46, Efka 47, Efka 452, Efka LP4008, Efka 4009, Efka LP4010, Efka LP4050, LP4055, Efka 400, Efka 401, Efka 402, Efka 403, Efka 450, Efka 451, Efka 453, Efka 4540, Efka 4550, Efka LP4560, Efka 120, Efka 150, Efka 1501, Efka 1502, or Efka 1503, Lubrizol Corporation Solsperse 3000, Solsperse 9000, Solsperse 13240, Solsperse 13650, Solsperse 13940, Solsperse 17000, 18000, Solsperse 20000, Solsperse 21000, Solsperse 20000, Solsperse 24000, Solsperse 26000, Solsperse 27000, Solsperse 28000, Solsperse 32000, Solsperse 36000, Solsperse 37000, Solsperse 38000, Solsperse 41000, Solsperse 42000, Solsperse 43000, Solsperse 46000, Solsperse 54000, or Solsperse 71000, or Ajinomoto Co., Ltd. Ajisper PB711, Ajisper PB821, Ajisper PB822, Ajisper PB814, Ajisper PN411, or Ajisper PA111; or a synthetic resin which is liquid and water-insoluble at room temperature, such as an acrylic resin, a urethane resin, an alkyd resin, natural rosin such as wood rosin, gum rosin, tall oil rosin, or the like, modified rosin such as polymerized rosin, disproportionated rosin, hydrogenated rosin, oxidized rosin, maleated rosin, or the like, or a rosin derivative such as rosin amine, lime rosin, a rosin alkyleneoxide adduct, a rosin alkyd adduct, rosin-modified phenol or the like. The addition of such a dispersant or resin contributes to a decrease in flocculation and to improvement in pigment dispersion stability and dispersion viscosity.

The triarylmethane compound of the present invention can be used for forming a color filter pixel portion by a conventional known method. A typical method for dispersing the triarylmethane compound of the present invention is a photolithographic method in which a photocurable composition described below is applied to a surface of a transparent substrate for a color filter on the side where a black matrix is provided, and heat-dried (prebaked), pattern exposure is performed by ultraviolet irradiation through a photomask to cure a photocurable compound in a portion corresponding to a pixel portion, an unexposed portion is developed with a developer, and a non-pixel portion is removed to fix the pixel portion to the transparent substrate. In this method, the pixel portion including a cured color film of the photocurable composition is formed on the transparent substrate.

The photocurable composition described below is prepared for each of the red, green, and blue colors, and the above-described operations are repeated to produce a color filter having red, green, and blue color pixel portions at predetermined positions. By using the triarylmethane compound of the present invention, the blue pixel portion can be formed. In order to prepare the photocurable compositions for forming the red pixel portion and green pixel portion, a publicly known common red pigment and green pigment can be used.

Examples of the pigment used for forming the red pixel portion include C. I. Pigment Red 177, 209, 242, and 254, and the like. Examples of the pigment used for forming the green pixel portion include C. I. Pigment Green 7, 10, 36, 47, and 58, and the like. The red pixel portion and the green pixel portion can also be formed by combination with a yellow pigment. If required, then, the whole color filter can be heat-treated (post-baked) for heat-curing the unreacted photocurable compound.

Examples of the method for applying the photocurable composition described below to the transparent substrate of glass or the like include a spin coating method, a roll coating method, an ink jet method, and the like.

The drying conditions of the coated film of the photocurable composition applied to the transparent substrate generally include 50 to 150° C. and about 1 to 15 minutes, depending upon the types of components, the mixing ratio, etc. As the light used for photo-curing the photocurable composition, ultraviolet light in the wavelength range of 200 to 500 nm or visible light is preferably used. In addition, various light sources which emit light in the wavelength range can be used.

Examples of the development method include a puddle method, a dipping method, a spray method, and the like. After exposure and development of the photocurable composition, the transparent substrate in which necessary color pixel portions have been formed is washed with water and dried. The thus-produced color filter is heat-treated (post-baked) at 90 to 280° C. for a predetermined time using a heating device such as a hot plate, an oven, or the like to remove volatile components in the color coating film and, at the same time, heat-cure the unreacted photocurable compound remaining in the cured color coating film of the photocurable composition, thereby completing the color filter.

The photocurable composition used for forming the blue pixel portion of the color filter can be prepared by mixing the triarylmethane compound of the present invention, a dispersant, a photocurable compound, and an organic solvent as essential components, and if required, a thermoplastic resin. When the colored resin film which forms the blue pixel portion is required to have high toughness sufficient to resist baking or the like which is performed in actual production of the color filter, the photocurable compound is essentially combined with the thermoplastic resin for preparing the photocurable composition. In the case of combination with the thermoplastic resin, the organic solvent which dissolves the resin is preferably used.

A general method for producing the photocurable composition includes mixing the triarylmethane compound of the present invention, the organic solvent, and the dispersant as essential components and uniformly stirring and dispersing the mixture to prepare a pigment dispersion solution for forming a pixel portion of the color filter, and then adding the photocurable compound and, if required, the thermoplastic resin, the photopolymerization initiator, etc. to the pigment dispersion solution, thereby producing the photocurable composition.

As the dispersant and the organic solvent, those described above can be used.

Examples of the thermoplastic resin used for preparing the photocurable composition include urethane resins, acrylic resins, polyamide resins, polyimide resins, styrene-maleic acid resins, styrene-maleic anhydride resins, and the like.

Examples of the photocurable compound include bifunctional monomers such as 1,6-hexanediol diacrylate, ethylene glycol diacrylate, neopentylglycol diacrylate, triethylene glycol diacrylate, bis(acryloxyethoxy)bisphenol A, 3-methylpentanediol diacrylate, and the like; polyfunctional monomers having relatively low molecular weight, such as trimethylolpropane triacrylate, pentaerythritol triacrylate, tris[2-(meth)acryloyloxyethyl)isocyanurate, dipentaerythritol hexaacrylate, dipentaerythritol pentaacrylate, and the like; and polyfunctional monomers having relatively high molecular weight, such as polyester acrylates, polyurethane acrylates, polyether acrylates, and the like.

Examples of the photopolymerization initiator include acetophenone, benzophenone, benzyldimethyl ketal, benzoyl peroxide, 2-chlorothioxanthone, 1,3-bis(4'-azidobenzal)-2-propane, 1,3-bis(4'-azidobenzal)-2-propane-2-sulfonic acid, 4,4'-diazidostilbene-2,2'-disulfonic acid, and the like. Examples of commercial photopolymerization initiators include "Irgacure (trade name)-184", "Irgacure (trade name)-369", and "Darocur (trade name)-1173" manufactured by Ciba Specialty Chemicals Co., Ltd.; "Lucirin-TPO" manufactured by BASF Corporation; "Kayacure (trade name) DETX" and "Kayacure (trade name) OA" manufactured by Nippon Kayaku Co., Ltd.; "Vicure-10" and "Vicure-55" manufactured by Stauffer Chemical Co., Ltd.; "Trigonal P1" manufactured by Akzo Co., Ltd.; "Sandoray-1000" manufactured by Sandoz Co., Ltd.; "Deap" manufactured by Apjohn Co., Ltd.; "Biimidazole" manufactured by Kuroganekasei Com., and the like.

Also, the photopolymerization initiator can be combined with a publicly known common photosensitizer Examples of the photosensitizer include amines, ureas, sulfur atom-containing compounds, phosphorus atom-containing compounds, chlorine atom-containing compounds, nitriles, other nitrogen atom-containing compounds, and the like. These can be used alone or in combination of two or more.

The mixing ratio of the photopolymerization initiator is not particularly limited, but is preferably in the range of 0.1 to 30% by mass relative to a compound having a photopolymerizable or photocurable functional group. With a mixing ratio of less than 0.1% by mass, sensitivity for photocuring tends to decrease, while with a mixing ratio exceeding 30% by mass, crystals of the photopolymerization initiator may be precipitated when a coating film of a pigment-dispersed resist is dried, thereby causing deterioration in physical properties of the coating film.

The pigment dispersion solution can be prepared by using the above-described materials, specifically by uniformly stirring and dispersing 300 to 1000 parts by mass of the organic solvent and 1 to 100 parts by mass of the dispersant relative to 100 parts by mass of the triarylmethane compound of the present invention. Next, the thermoplastic resin and the photocurable compound in a total of 3 to 20 parts by mass per part by mass of the triarylmethane compound of the present invention, 0.05 to 3 parts by mass of the photopolymerization initiator per part by mass of the photocurable compound, and, if required, the organic solvent are added to the pigment dispersion solution, and the resultant mixture is uniformly stirred and dispersed to prepare the photocurable composition for forming a color filter pixel portion.

As the developer, a publicly known common organic solvent or aqueous alkali solution can be used. In particular, when the photocurable composition contains the thermoplastic resin or the photocurable compound and at least one of these has an acid value and exhibits alkali solubility, washing with an aqueous alkali solution is effective for forming a color filter pixel portion.

Although the method for producing a color filter pixel portion by the photolithographic method used as the pigment dispersion method is described in detail above, the color filter pixel portion prepared using the pigment composition for a color filter of the present invention may be formed by another method for forming a blue pixel portion, such as an electrodeposition method, a transfer method, a micelle electrolytic method, a PVED (Photovoltaic Electrodeposition) method, an ink jet method, a reverse printing method, a thermal curing method, or the like, thereby producing a color filter.

The color filter can be produced by a method in which the photocurable compositions of the respective colors prepared using a red pigment, a green pigment, and the triarylmethane compound of the present invention as organic pigments are used, a liquid crystal material is sealed between a pair of transparent parallel electrodes, each of the electrodes is divided into discontinuous fine regions, and color filter colored pixel portions of one color selected from red, green, and blue are provided alternately in the fine regions of a lattice pattern provided by a black matrix on the transparent electrodes. Alternatively, a transparent electrode may be provided after the color filter colored pixel portions are formed on a substrate.

The triarylmethane compound of the present invention can provide a color pigment dispersion having excellent clarity and lightness and can be applied to, besides color filters, coloring of a coating material, plastic (resin moldings), printing ink, rubber, leather, textile printing, electrostatic development toner, ink jet recording ink, heat transfer ink, etc.

The present invention is described in further detail below with reference to examples, but the present invention is, of course, not limited to the scope of these examples. In addition, "parts", "%", and "ppm" are on a mass basis unless otherwise specified.

EXAMPLE 1

Synthesis of Triarylmethane Compound Laked with Dawson-type $(P_2MoW_1O_{62})^{6-}$ Heteropolyoxometalate (1) Preparation 1 of $K_6(P_2MoW_{17}O_{62})$ First, 44.0 g of $NaWO_4 \cdot 2H_2O$ (reagent manufactured by Wako Pure Chemical Industries, Ltd.) and 1.90 g of $Na_2MoO_4 \cdot 2H_2O$ (reagent manufactured by Kanto Chemical Co., Ltd.) were dissolved in 230 g of purified water. Then, 64.9 g of 85% phosphoric acid was added to the resultant solution using a dropping funnel under stirring. The resultant solution was heated under reflux for 8 hours. After the reaction solution was cooled to room temperature, a drop of bromine water was added, and 45 g of potassium chloride was added under stirring. As a result, a heteropoly acid was produced.

After further stirring for 1 hour, the produced yellow precipitates of $K_6(P_2MoW_{17}O_{62})$ were filtered off and then dried at 90° C. The yield was 29.4 g.

Analysis with Fourier transform infrared spectrophotometer (FT-IR) (KBr/cm$^{-1}$):

1091, 960, 915, 783, 530

Elemental analysis (W, Mo, K, P elemental analysis) was performed by emission spectroscopic analysis using high-frequency inductively coupled plasma (ICP) as a light source.

W, Mo, K, P elemental analysis (Each of the values in a table is indicated by % by mass. The same is true for tables below.):

TABLE 1

|       | K   | P   | Mo  | W    |
|-------|-----|-----|-----|------|
| Calcd | 5.0 | 1.3 | 2.0 | 66.7 |
| Found | 5.2 | 0.9 | 1.7 | 66   |

The above revealed that the resultant product has the following composition:

Calcd.: $K_6(P_2Mo_1W_{17}O_{62})$–9.8$H_2O$

From the analysis results of FT-IR and W, Mo, K, P elemental analysis, it was confirmed that the dry product was $K_6(P_2MoW_{17}O_{62})$.

(2) Production of Dawson-type $(P_2MoW_{17}O_{62})$triarylmethane Compound

First, 5.30 g of C. I. Basic Blue 7 (reagent manufactured by Tokyo Chemical Industry Co., Ltd.) was poured into 350 ml of purified water and dissolved by stirring at 40° C. Then, 10.0 g of $K_6(P_2MoW_{17}O_{62})$ produced in the above-described preparation 1 was dissolved in 40 ml of purified water. The $K_6(P_2MoW_{17}O_{62})$ solution was poured into the C. I. Basic Blue 7 solution, directly followed by stirring at 40° C. for 1 hour. Then, the internal temperature was increased to 80° C., and the mixture was further stirred at this temperature for 1 hour. After cooling, the mixture was filtered, and the filtration residue was washed three times with 300 ml of purified water. The resultant solid was dried at 90° C. to produce 10.4 g of black-blue solid. The product composed of the solid had an average primary-particle diameter of 40 nm. The solid was ground with a commercial juicer to produce a triarylmethane lake pigment having, in the general formula (I), an ethyl group as each of $R^1$, $R^2$, and $R^3$, a hydrogen atom as $R^4$, and a heteropolyoxometalate anion as $X^-$ represented by $(P_2MoW_{17}O_{62})^{6-}$/6.

For the resultant triarylmethane lake pigment, Fourier transform infrared spectroscopy, elemental analysis (CHN elemental analysis) by a thermal conductivity method, and elemental analysis (W, Mo, K, P elemental analysis) by an emission spectroscopic analysis using a high-frequency inductively coupled plasma (ICP) as a light source were carried out. The results are shown below.

Analysis with Fourier transform infrared spectrophotometer (FT-IR) (KBr/cm$^{-1}$):
2970, 1579, 1413, 1342, 1273, 1185, 1155, 1073, 954, 911, 786

CHN elemental analysis and W, Mo, K, P elemental analysis

TABLE 2

|        | C     | H    | N    | K   | P   | W    | Mo  |
|--------|-------|------|------|-----|-----|------|-----|
| Calcd. | 31.82 | 3.37 | 3.37 | 0.2 | 0.9 | 44.0 | 1.4 |
| Found  | 31.82 | 3.41 | 3.42 | 0.3 | 0.9 | 45.1 | 1.1 |

The above revealed that the resultant product has the following composition:

Calcd.: $(C_{33}H_4O_1N_3)_{5.7}K_{0.3}(P_2Mo_1W_{17}O_{62})$–4.7$H_2O$

From the FT-IR analysis results of C. I. Basic Blue 7, FT-IR analysis results of $K_6(P_2MoW_{17}O_{62})$, and the FT-IR analysis results of the product, it was confirmed that the product maintains the cation structure of C. I. Basic Blue 7 and the anion structure of $K_6(P_2MoW_{17}O_{62})$.

Also it was confirmed from the results of elemental analysis that in the product, K of $K_6(P_2MoW_{17}O_{62})$ is substituted by the cation structure of C. I. Basic Blue 7, forming an ionic bond between the cation structure and the anion structure. This is clear from a sufficiently low content of potassium (K).

On the basis of these facts, the resultant product could be identified as a triarylmethane compound of the general formula (I) composed of a cation having an ethyl group as each of $R^1$, $R^2$, and $R^3$ and a hydrogen atom as $R^4$, and a Dawson-type polyoxometalate anion as $X^-$ represented by $(P_2MoW_{17}O_{62})^{6-}$/6.

EXAMPLE 2

Synthesis of Triarylmethane Compound Laked with Dawson-type $(P_2MoW_{17}O_{62})^{6-}$ Heteropolyoxometalate (1) Preparation 2 of $K_6(P_2MoW_{17}O_{62})$ First, 0.762 g of $Na_2MoO_4.2H_2O$ (the same as above) was dissolved in 150 ml of purified water. Then, 14.2 ml of a 4 mol/l aqueous HCl solution was added to the resultant solution under stirring, and 12.4 g of $K_{10}$ (α2-type $P_2W_{17}O_{61}$). 20$H_2O$ prepared by a method described in Inorganic Synthesis vol. 27, p. 104 was added to the resultant mixture, followed by stirring at room temperature 1 hour. The reaction solution was filtered with glass filter paper, and then 20 g of potassium chloride was added to the filtrate, followed by stirring for 1 hour. Yellow precipitates of $K_6(P_2MoW_{17}O_{62})$ produced by allowing to stand overnight in a refrigerator were filtered off, washed with a small amount of a 2 mol/l aqueous potassium chloride solution, and then dried at room temperature under reduced pressure. The yield was 10.9 g.

Analysis with Fourier transform infrared spectrophotometer (FT-IR) (KBr/cm$^{-1}$):
1090, 960, 918, 786, 530

From the FT-IR analysis results, it was confirmed that the dried product is $K_6(P_2MoW_{17}O_{62})$ produced in (of Example 1. CHN elemental analysis and W, Mo, K, P elemental analysis showed substantially the same results as in Example 1.

Next, a triarylmethane lake pigment was produced by the same method as in (2) of Example 1 except that $K_6(P_2MoW_{17}O_{62})$ prepared as described above was used, the pigment having an average primary-particle diameter of 40 nm and including, in the general formula (I), an ethyl group as each of $R^1$, $R^2$, and $R^3$, a hydrogen atom as $R^4$, and a heteropolyoxometalate anion as $X^-$ represented by $(P_2MoW_{17}O_{62})^{6-}$/6.

EXAMPLE 3

Synthesis of Triarylmethane Compound Laked with Dawson-type $(P_2Mo_2W_{16}O_{62})^{6-}$ Heteropolyoxometalate (1) Preparation of $K_6(P_2Mo_2W_{16}O_{62})$ First, 26.7 g of $NaWO_4.2H_2O$ (the same as above) and 2.44 g of $Na_2MoO_4.2H_2O$ (the same as above) were dissolved in 140 ml of purified water. Then, 41.8 g of 85% phosphoric acid was added to the resultant solution using a dropping funnel under stirring. The resultant solution was heated under reflux for 8 hours. After the reaction solution was cooled to room temperature, 30 g of potassium chloride was added under stirring. After stirring for 1 hour, the produced yellow precipitates of $K_6(P_2Mo_2W_{16}O_{62})$ were filtered off and then dried at 90° C. The yield was 20.4 g.

Analysis with Fourier transform infrared spectrophotometer (FT-IR) (KBr/cm$^{-1}$):
1092, 960, 910, 796, 526

From the FT-IR analysis results, it was confirmed that the dried product is $K_6(P_2Mo_2W_{16}O_{62})$.

(2) Production of Dawson-type $(P_2Mo_2W_{16}O_{62})$triarylmethane Compound

First, 10.1 g of C. I. Basic Blue 7 (reagent manufactured by Tokyo Chemical Industry Co., Ltd.) was poured into 600 ml of purified water and dissolved by stirring at. 40°. In addition, 17.4 g of $K_6(P_2Mo_2W_{16}O_{62})$ prepared by the above-described method was dissolved in 200 ml of purified water. The $K_6(P_2Mo_2W_{16}O_{62})$ solution was poured into the C. I. Basic Blue 7 solution, directly followed by stirring at 40° C. for 1 hour. Then, the internal temperature was increased to 80° C., and the mixture was further stirred at this temperature for 1 hour. After cooling, the mixture was filtered, and the filtration residue was washed three times with 300 ml of purified water. The resultant solid was dried at 90° C. to produce 21.1 g of black-blue solid. The product composed of the solid had an average primary-particle diameter of 70 nm. The solid was ground with a commercial juicer to produce a triarylmethane lake pigment having, in the general formula (I), an ethyl group as each of $R^1$, $R^2$, and $R^3$, a hydrogen atom as $R^4$, and a heteropolyoxometalate anion as $X^-$ represented by $(P_2Mo_2W_{16}O_{62})^{6-}/6$.

FT-IR and elemental analysis were carried out by the same method as in Example 1. The results are shown below.

Analysis with Fourier transform infrared spectrophotometer (FT-IR) (KBr/cm$^{-1}$):

2974, 1579, 1414, 1344, 1274, 1186, 1157, 1090, 955, 910, 793

CHN elemental analysis and W, Mo, K, P elemental analysis:

TABLE 3

|  | C | H | N | K | P | Mo | W |
|---|---|---|---|---|---|---|---|
| Calcd | 30.61 | 3.30 | 3.24 | 0.4 | 0.9 | 2.8 | 42.9 |
| Found | 30.43 | 3.47 | 3.33 | 0.2 | 0.8 | 2.3 | 43.8 |

The above revealed that the resultant product has the following composition:

Calcd.: $(C_{33}H_4O_1N_3)_{5.3}K_{0.7}(P_2Mo_2W_{16}O_{62})$–$6.2H_2O$

From the FT-IR analysis results of C. I. Basic Blue 7, FT-IR analysis results of $K_6(P_2Mo_2W_{16}O_{62})$, and the FT-IR analysis results of the product, it was confirmed that the product maintains the cation structure of C. I. Basic Blue 7 and the anion structure of $K_6(P_2Mo_2W_{16}O_{62})$. Also it was confirmed from the results of elemental analysis that in the product, K of $K_6(P_2Mo_2W_{16}O_{62})$ is substituted by the cation structure of C. I. Basic Blue 7, forming an ionic bond between the cation structure and the anion structure. This is clear from a sufficiently low content of potassium (K).

On the basis of these facts, the resultant product could be identified as a triarylmethane compound of the general formula (I) composed of a cation having an ethyl group as each of $R^1$, $R^2$, and $R^3$ and a hydrogen atom as $R^4$, and a Dawson-type polyoxometalate anion as $X^-$ represented by $(P_2Mo_2W_{16}O_{62})^{6-}/6$.

EXAMPLE 4

Synthesis of Triarylmethane Compound Laked with Dawson-type $(P_2Mo_3W_{15}O_{62})^{6-}$ Heteropolyoxometalate (1) Preparation of $K_6(P_2Mo_3W_{15}O_{62})$ First, 25.0 g of $NaWO_4.2H_2O$ (the same as above) and 3.68 g of $Na_2MoO_4.2H_2O$ (the same as above) were dissolved in 140 ml of purified water. Then, 41.8 g of 85% phosphoric acid was added to the resultant solution using a dropping funnel under stirring. The resultant solution was heated under reflux for 8 hours. After the reaction solution was cooled to room temperature, a drop of bromine water was added to the solution, and 30 g of potassium chloride was added under stirring. After stirring for 1 hour, the produced yellow precipitates of $K_6(P_2Mo_3W_{15}O_{62})$ were filtered off and then dried at 90° C. The yield was 20.4 g.

Analysis with Fourier transform infrared spectrophotometer (FT-IR) (KBr/cm$^{-1}$):

1092, 960, 912, 795, 528

From the FT-IR analysis results, it was confirmed that the dried product is $K_6(P_2Mo_3W_{15}O_{62})$.

(2) Production of Dawson-type $(P_2Mo_3W_{15}O_{62})$triarylmethane Compound

First, 9.7 g of C. I. Basic Blue 7 (reagent manufactured by Tokyo Chemical Industry Co., Ltd.) was poured into 600 ml of purified water and dissolved by stirring at 40° C. In addition, 17.3 g of $K_6(P_2Mo_3W_{15}O_{62})$ prepared by the above-described method was dissolved in 400 ml of purified water. The $K_6(P_2Mo_3W_{15}O_{62})$ solution was poured into the C. I. Basic Blue 7 solution, directly followed by stirring at 40° C. for 1 hour. Then, the internal temperature was increased to 80° C., and the mixture was further stirred at this temperature for 1 hour. After cooling, the mixture was filtered, and the filtration residue was washed three times with 300 ml of purified water. The resultant solid was dried at 90° C. to produce 20.8 g of black-blue solid. The product composed of the solid had an average primary-particle diameter of 60 nm. The solid was ground with a commercial juicer to produce a triarylmethane lake pigment having, in the general formula (I), an ethyl group as each of $R^1$, $R^2$, and $R^3$, a hydrogen atom as $R^4$, and a heteropolyoxometalate anion as $X^-$ represented by $(P_2Mo_3W_{15}O_{62})^{6-}/6$.

FT-IR and elemental analysis were carried out by the same method as in Example 1. The results are shown below.

Analysis with Fourier transform infrared spectrophotometer (FT-IR) (KBr/cm$^{-1}$):

2974, 1579, 1414, 1344, 1275, 1186, 1159, 1090, 955, 910, 796

CHN elemental analysis and W, Mo, K, P elemental analysis:

TABLE 4

|  | C | H | N | K | P | Mo | W |
|---|---|---|---|---|---|---|---|
| Calcd | 30.66 | 3.29 | 3.25 | 0.5 | 0.9 | 4.3 | 41.0 |
| Found | 30.74 | 3.46 | 3.41 | 1.4 | 0.6 | 3.4 | 41.8 |

The above revealed that the resultant product has the following composition:

Calcd.: $(C_{33}H_4O_1N_3)_{5.2}K_{0.8}(P_2Mo_3W_{15}O_{62})$–$5.7H_2O$

From the FT-IR analysis results of C. I. Basic Blue 7, FT-IR analysis results of $K_6(P_2Mo_3W_{15}O_{62})$ and the FT-IR analysis results of the product, it was confirmed that the product maintains the cation structure of C. I. Basic Blue 7 and the anion structure of $K_6(P_2Mo_3W_{15}O_{62})$. Also it was confirmed from the results of elemental analysis that in the product, K of $K_6(P_2Mo_3W_{15}O_{62})$ is substituted by the cation structure of C. I. Basic Blue 7, forming an ionic bond between the cation structure and the anion structure. This is clear from a sufficiently low content of potassium (K).

On the basis of these facts, the resultant product could be identified as a triarylmethane compound of the general formula (I) composed of a cation having an ethyl group as each of $R^1$, $R^2$, and $R^3$ and a hydrogen atom as $R^4$, and a Dawson-type polyoxometalate anion as $X^-$ represented by $K_6(P_2Mo_3W_{15}O_{62})^{6-}/6$.

EXAMPLE 5

In a poly-bottle, 1.80 parts of triarylmethane compound produced in Example 1, 2.10 parts of BYK-2164 (manufactured by BYK Chemie Co. Ltd.), 11.10 parts of propylene glycol monomethyl ether acetate, and SEPR beads of 0.3-0.4 mm in diameter were placed and dispersed for 4 hours with a paint conditioner (manufactured by Toyo Seiki Co., Ltd.) to prepare a pigment dispersion solution. Then, 75.00 parts of the pigment dispersion solution, 5.50 parts of a polyester acrylate resin (Aronix (trade name) M7100, manufactured by Toagosei Co., Ltd.), 5.00 parts of dipentaerythritol hexaacrylate (KAYARAD (trade name) DPHA, manufactured by Nippon Kayaku Co., Ltd.), 1.00 part of benzophenone (KAYACURE (trade name) BP-100, manufactured by Nippon Kayaku Co., Ltd.), and 13.5 parts of Ucar Ester EEP (manufactured by Union Carbide Corporation) were stirred with a dispersion stirrer, and the resultant mixture was filtered with a filter having a pore size of 1.0 μm to produce a color resist (photocurable composition). The color resist was applied to a glass of 50 mm×50 mm and 1 mm in thickness using a spin coater so that a dry thickness was 2 μm, and then pre-dried at 90° C. for 20 minutes to form a coating film, thereby forming a color filter including a blue pixel portion.

EXAMPLE 6

A color filter including a blue pixel portion was produced by the same operation as in Example 5 except that the triarylmethane compound prepared in Example 3 was used in the same amount in place of the triarylmethane compound prepared in Example 1.

EXAMPLE 7

A color filter including a blue pixel portion was produced by the same operation as in Example 5 except that the triarylmethane compound prepared in Example 4 was used in the same amount in place of the triarylmethane compound prepared in Example 1.

COMPARATIVE EXAMPLE 1

A color filter including a blue pixel portion was produced by the same operation as in Example 5 except that BASF Corporation FANAL BLUE D6340 (containing Keggin-type phosphotungstomolybcic acid as an anion) was used in the same amount in place of the triarylmethane compound prepared in Example 1.

Each of the color filters of Examples 5 to 7 and Comparative Example 1 was measured with respect to a change in hue and a change in brightness immediately after preparation (before light irradiation) and after light irradiation as follows.

<Light Resistance Test>

Each of the blue color filters produced as described above was irradiated with light using a xenon light resistance tester (Suntest CPS+ manufactured by ATLAS Corporation) under the conditions of 550 W/m², 63° C., and 48 hours, and chromaticity and brightness were measured with spectrophotometer CM-3500d manufactured by Konica Minolta Inc. before and after irradiation to compare color differences ΔE*ab and brightness changes. The results are shown in Table 5.

TABLE 5

| | Lake anion (X⁻) | Brightness before irradiation | Brightness after irradiation | ΔE*ab |
|---|---|---|---|---|
| Example 5 | $(P_2MoW_{17}O_{62})^{6-}$ | 15.72 | 13.54 | 5.80 |
| Example 6 | $(P_2Mo_2W_{16}O_{62})^{6-}$ | 15.34 | 13.72 | 4.44 |
| Example 7 | $(P_2Mo_3W_{15}O_{62})^{6-}$ | 15.31 | 13.96 | 4.05 |
| Comparative Example 1 | Keggin-type phosphotungstomolybdic acid | 15.77 | 12.89 | 8.09 |

<Heat Resistance Test>

Each of the blue color filters of Examples 5 to 7 and Comparative Example 1 was placed in an oven at 210° C. for 3 hours, and chromaticity and brightness were measured with spectrophotometer CM-3500d manufactured by Konica Minolta Inc. before and after heating to compare color differences ΔE*ab and brightness changes. The results are shown in Table 6.

TABLE 6

| | Lake anion (X⁻) | Brightness before post-baking | Brightness after post-baking | ΔE*ab |
|---|---|---|---|---|
| Example 5 | $(P_2MoW_{17}O_{62})^{6-}$ | 15.77 | 14.70 | 5.90 |
| Example 6 | $(P_2Mo_2W_{16}O_{62})^{6-}$ | 15.32 | 14.24 | 6.79 |
| Example 7 | $(P_2Mo_3W_{15}O_{62})^{6-}$ | 15.33 | 13.67 | 8.01 |
| Comparative Example 1 | Keggin-type phosphotungstomolybdic acid | 15.78 | 0.28 | 21.36 |

Table 5 indicates that the triarylmethane compound of the present invention causes a significantly smaller change in brightness before and after irradiation than a conventional triarylmethane compound, and that the smaller the amount of Mo in the anion, the higher the brightness before irradiation, and the larger the Mo amount in the anion, the smaller the change in brightness before and after irradiation.

Table 6 indicates that the triarylmethane compound of the present invention causes a significantly smaller change in brightness before and after heating than a conventional triarylmethane compound, and that the smaller the amount of Mo in the anion, the higher the brightness before heating, and the smaller the Mo amount in the anion, the smaller the change in brightness before and after heating.

This reveals that it is possible to provide a high-brightness liquid crystal display device or the like which is capable of a liquid crystal display having excellent brightness over a long period of time even under a high temperature or light irradiation.

INDUSTRIAL APPLICABILITY

According to the present invention, due to the specific heat resistance and light resistance of a triarylmethane compound of the present invention, it is possible to provide a colored material causing a small change in hue over a long period of time even under heat history at a high temperature or under light irradiation. In particular, when used for preparing a blue pixel portion of a color filter, the triarylmethane compound can provide a high-brightness liquid crystal display device capable of a liquid crystal display with excellent brightness over a long period of time even under a high temperature or light irradiation while maintaining a usual level of light resistance.

The invention claimed is:

1. A compound represented by general formula (I) below:

(I)

where $R^1$, $R^2$, $R^3$, and $R^4$ may be the same or different and are each a hydrogen atom, an alkyl group having 1 to 3 carbon atoms, or a phenyl group, and $X^-$ is a heteropolyoxometalate anion represented by $(P_2Mo_yW_{18-y}O_{62})^{6-}/6$ wherein y=an integer of 1, 2, or 3.

2. The compound according to claim 1 represented by the general formula (I), wherein all $R^1$, $R^2$, and $R^3$ are ethyl groups, and $R^4$ is a hydrogen atom.

3. A color filter comprising a blue pixel portion which contains the compound according to claim 1.

4. A color filter comprising a blue pixel portion which contains the compound according to claim 2.

* * * * *